(12) United States Patent
Kirisawa (10) Patent No.: US 8,743,706 B2
(45) Date of Patent: Jun. 3, 2014

(54) TRANSMISSION CIRCUIT AND RADIO COMMUNICATION APPARATUS

(75) Inventor: Akihiro Kirisawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/922,798

(22) PCT Filed: Mar. 26, 2009

(86) PCT No.: PCT/JP2009/056130
§ 371 (c)(1),
(2), (4) Date: Sep. 15, 2010

(87) PCT Pub. No.: WO2009/119743
PCT Pub. Date: Oct. 1, 2009

(65) Prior Publication Data
US 2011/0026426 A1 Feb. 3, 2011

(30) Foreign Application Priority Data

Mar. 27, 2008 (JP) .................................. 2008-083675

(51) Int. Cl.
*H04J 3/14* (2006.01)
*H04L 12/26* (2006.01)
*H04B 10/077* (2013.01)

(52) U.S. Cl.
CPC ............ *H04L 43/50* (2013.01); *H04B 10/0771* (2013.01)
USPC ........................................................ 370/244

(58) Field of Classification Search
CPC ........ H04L 43/00; H04L 43/50; H04B 10/07; H04B 10/0771; H04W 24/00
USPC ......... 370/241, 242, 243, 244, 247, 276, 277, 370/278, 279, 280; 455/73, 84, 85, 550.1, 455/91, 115.1
See application file for complete search history.

(56) References Cited

U.S. PATENT DOCUMENTS

| 5,640,401 | A | * | 6/1997 | Yamada .......................... 714/716 |
| 5,754,949 | A | * | 5/1998 | Kumagai et al. ............ 455/115.1 |
| 2005/0095993 | A1 | * | 5/2005 | Kim et al. ......................... 455/78 |
| 2006/0035600 | A1 | * | 2/2006 | Lee et al. .......................... 455/78 |
| 2006/0035601 | A1 | * | 2/2006 | Seo .................................. 455/78 |

(Continued)

FOREIGN PATENT DOCUMENTS

| JP | 61-62423 A | 4/1986 |
| JP | 64-48524 A | 2/1989 |

(Continued)

OTHER PUBLICATIONS

International Search Report for PCT/JP2009/056130 mailed Jun. 9, 2009.
Taiwanese Office Action for TW098110119 dated Oct. 30, 2012.

*Primary Examiner* — Obaidul Huq
(74) *Attorney, Agent, or Firm* — Sughrue Mion, PLLC (57) ABSTRACT

In a transmission circuit used in a TDD scheme, a preset current is supplied from a current source to a detection diode via a switch that is made conductive during a reception period and made non-conductive during a transmission period. A determination is made if the output of the detection diode is within a predetermined specified range and, if the output is out of the specified range, a judgment is made that the detection diode is faulty.

17 Claims, 11 Drawing Sheets

(56) References Cited

U.S. PATENT DOCUMENTS

2007/0248069 A1* 10/2007 Kim .............................. 370/338
2007/0274238 A1* 11/2007 Kim .............................. 370/280
2007/0291668 A1* 12/2007 Duan ........................... 370/280
2009/0003505 A1*  1/2009 Park .............................. 375/376

FOREIGN PATENT DOCUMENTS

| JP | 2001274646 A | 10/2001 |
| JP | 2003037509 A | 2/2003 |
| WO | 2007083924 A1 | 7/2007 |

* cited by examiner

-- RELATED ART --

TRANSMISSION CIRCUIT AND RADIO COMMUNICATION APPARATUS

REFERENCE TO RELATED APPLICATION

The present invention is the National Phase of PCT/JP2009/056130, filed Mar. 26, 2009, which is based upon and claims the benefit of the priority of Japanese patent application No. 2008-083675, filed on Mar. 27, 2008, the disclosure of which is incorporated herein in its entirety by reference thereto.

TECHNICAL FIELD

The present invention relates to a transmission circuit used for a radio communication apparatus, and more particularly to a transmission circuit in the Time Division Duplex (TDD) scheme.

BACKGROUND

Figure 11:
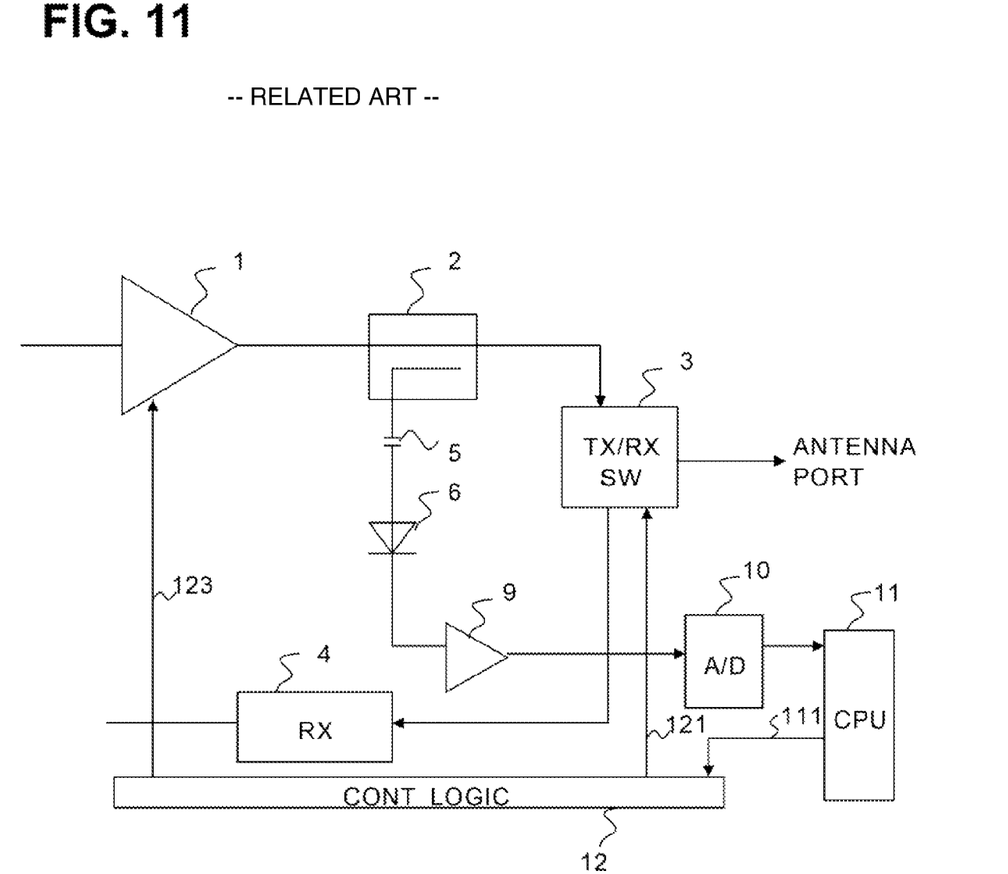
FIG. 11 is a diagram schematically showing the configuration of the transmission unit of a typical radio communication apparatus in the TDD scheme.

In a transmission circuit of a radio apparatus operating in Time Division Duplex (abbreviated to TDD) in which data is transmitted and received simultaneously by switching between transmission and reception speedily in a time division manner, a portion of a transmission signal is sampled and a transmission level is checked using a diode detector in order to monitor the transmission signal. FIG. 11 shows an example of the typical configuration of a transmission circuit of a radio apparatus employing the time division duplex (TDD) scheme. Referring to FIG. 11, the transmission circuit comprises a transmission amplifier 1, a directional coupler 2, a transmission/reception changing-over switch (TX/RX SW) 3, a reception circuit (RX) 4, a DC cut capacitor 5, a detection diode 6, an OP amp (operational amplifier) 9, an A/D converter 10, a CPU (Central Processing Unit) 11, and a control logic (control unit) 12.

After a transmission signal is amplified by the transmission amplifier 1 to a desired output level, a portion of the transmission power is extracted out by the directional coupler 2 and a voltage corresponding to a transmission output is detected by the detection diode 6. The output voltage of the detection diode 6 is received by the OP amp 9 (for example, configured as a voltage follower). An output of the OP amp 9 is converted to a digital signal by the A/D converter 10. An output of the A/D converter 10 is supplied to the CPU 11. The CPU 11 monitors the transmission signal and performs alarm-decision of an output level.

For the configuration for detecting (envelope detection) a branch of the transmission power with a diode, see the description in Patent Document 1, for example.
Patent Document 1:
JP Patent Kokai Publication No. JP-P2001-274646A

SUMMARY

The entire disclosure of the above Patent Document 1 is incorporated herein by reference thereto. The following gives the analysis of the related technologies by the present invention.

When the detection diode 6 fails in the configuration shown in FIG. 11, the transmission output cannot be monitored correctly. A deterioration or failure in the detection diode sometimes results in an erroneous transmission of an over-output.

In some other case, the transmission amplifier 1 is set into an over-output state, and the detection diode 6 is damaged by an over-input. Thus, an over-output alarm cannot be transmitted.

Accordingly, it is an object of the present invention to provide a transmission circuit, a radio communication apparatus, and a test method for avoiding an abnormal transmission output even when the detection circuit fails.

The invention provides the following general configuration, but not limited thereto.

In the present invention, a test signal is supplied to a detector, which detects a signal branched from a transmission signal, at a specified timing at which the signal branched from the transmission signal is not input to the detector and whether the detector is faulty or not is detected based on the output of the detector. In the present invention, the output of a current source is connected to a detection diode, which constitutes the detector, via a switch that is turned off (non-conductive) and turned on (conductive), respectively, during a transmission period and a reception period in a TDD (Time Division Duplex) scheme in which transmission and reception are switched in a time division manner. In the present invention, a determination is made if the output of the detection diode, generated when a preset current is supplied from the current source to the detection diode, during the reception period, is within a predetermined specified range and, if the output is out of the specified range, a judgment is made that the detector is faulty and an alarm is output.

According to the present invention, by detecting an abnormal condition in a detection circuit, it is possible to avoid that a transmission output becomes an abnormal value.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

The following describes exemplary embodiments of the present invention. In one of modes of the present invention, a test signal (for example, an output current of a current source 8) is supplied to a detector (detection diode 6), which detects a signal branched from a transmission signal, at a preset timing during which the signal branched from the transmission signal is not supplied to the detector and, based on an output of the detector, whether the detector is faulty or not is detected. In the present invention, the output of the current source (8) is connected to a detection diode (6) via a switch (7) that is controlled to be turned off (non-conductive) and to be turned on (conductive), respectively, during a transmission period and a reception period in a TDD (Time Division Duplex) scheme, in which transmission and reception are switched in a time division manner. A CPU (computing unit) (11) determines whether or not the output of the detection diode (6), generated when a preset current is supplied from the current source (8) to the detection diode (6), during the reception period, is within a specified range (for example, REF ALM in FIG. 5A) that is predefined. When the output of the detection diode (6), is out of the specified range, a decision is made by the CPU (111) that the detector is faulty and an alarm is output.

In another mode of the present invention, an output of an oscillator (16 in FIG. 8) is connected to a detection diode (6) via a switch (RF switch 7' in FIG. 8) that is turned off and on, respectively, during a transmission period and a reception period in a TDD scheme in which transmission and reception are switched in a time division manner. During the reception period, a determination is made by an CPU (11) whether or not an output of the detection diode (6) is within a specified range corresponding to an output level of an oscillator (16). When the output of the detection diode (6) is out of the specified range, a decision is made by the CPU (11) that the detector is faulty and a signal (111) indicating an alarm is output.

In the present invention, a detection output of the detection diode is compared with an upper limit value corresponding to an over-output, and with a lower limit value corresponding to a low-output, during the transmission period, and, if an over-output or a low-output is detected, a signal (111) indicating an over-output alarm or a low-output alarm is output.

In the present invention, a configuration is also possible in which the detector comprises a plurality of diodes (6, 6b9 in FIG. 9) that receive in common a branched signal of the transmission signal and, during the reception period, a current is supplied to the plurality of diodes via a switch and output voltages of the plurality of diodes are compared to decide whether the diodes are faulty or not. The exemplary embodiments of the present invention will be described below with reference to the drawings.

Figure 1:
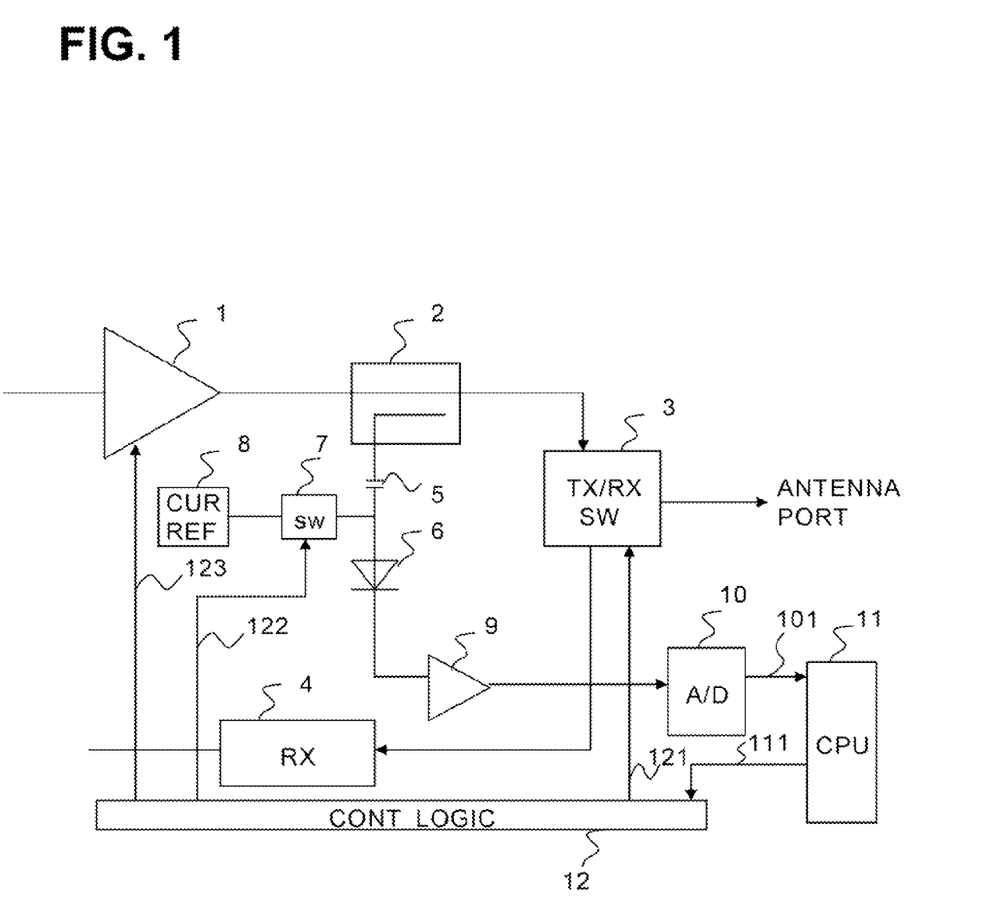
FIG. 1 is a diagram showing the configuration of a first exemplary embodiment of the present invention.

FIG. 1 is a diagram showing the configuration of a transmission power detection circuit in a first exemplary embodiment of the present invention. Referring to FIG. 1, the transmission power detection circuit comprises a transmission amplifier 1, a directional coupler 2, a transmission/reception changing-over switch (TX/RX SW) 3, a reception circuit (RX) 4, a DC cut capacitor 5, a detection diode 6, an analog switch 7, a reference current source 8, an OP amp (operational amplifier) 9, an A/D converter 10, a CPU (Central Processing Unit) 11, and a control logic (control unit) 12. It is noted that current source 8, switch 7, and control logic 12 in the present embodiment may be grouped to form a first circuit block (first unit) and OP amp 9, A/D converter 10, and CPU 11 may be grouped to form a second circuit block (a second unit).

A transmission signal is supplied to the transmission amplifier 1 that outputs an amplified transmission signal. The transmission signal, output from the transmission amplifier 1, passes through the directional coupler 2 and, when the burst signal is transmitted, the transmission signal is output from an antenna port by the transmission/reception changing-over switch (TX/RX SW) 3. At reception time, an input signal from the antenna port is connected to the reception circuit 4 via the transmission/reception changing-over switch 3.

A coupling port output of the directional coupler 2 is supplied to the detection diode 6 via the DC cut capacitor 5 and, in addition, to the A/D converter 10 via the OP amp 9. To an anode terminal of the detection diode 6, the output terminal of the reference current source 8 is connected via the analog switch 7.

An output 101 of the A/D converter 10 is supplied to the CPU 11. The output of the CPU 11 is supplied to the control logic 12.

The control logic 12 outputs a control signal 121 for controlling transmission/reception switching performed by the transmission/reception changing-over switch 3 and a control signal 122 for controlling on and off of the analog switch 7.

The control logic 12 outputs a signal 123 for controlling the transmission amplifier 1.

Next, the following describes the operation of the present invention. The transmission apparatus shown in FIG. 1 employs the Time Division Duplex (TDD) scheme in which transmission and reception are performed in a time-division manner.

At a transmission timing, the transmission signal is amplified to a desired power level as a burst signal and is output from the antenna port and, at a reception timing, a signal received by an antenna, not shown, is received and processed by the reception circuit 4. At a transmission timing, after the transmission signal is amplified by the transmission amplifier 1 to a desired output level, a portion of the transmission power is sampled by the directional coupler 2 and the voltage corresponding to the transmission output is detected by the detection diode 6.

Figure 2A:
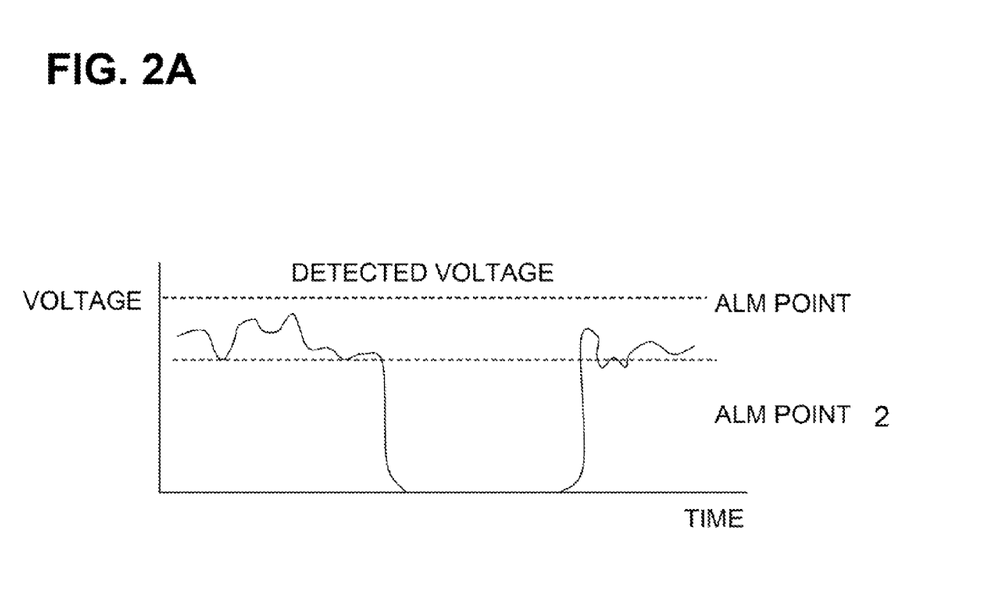
FIGS. 2A and 2B are diagrams showing the waveforms of the detected voltage and the control signal in the first exemplary embodiment of the present invention.
Figure 2B:
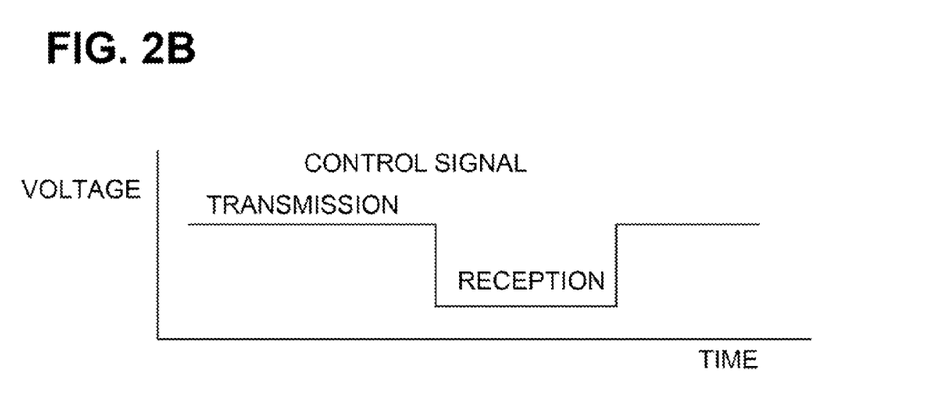

FIGS. 2A and 2B are diagrams showing the relation between the transmission output level and the detected voltage at this timing. The level of the transmission signal, which is a modulated signal, varies and the detected voltage also varies in proportion to this signal level (FIG. 2A).

The control signal is used in the TDD scheme to switch between transmission and reception. FIG. 2B is a timing diagram showing this switching. The control signal 121 is set to a High level for transmission, and to a Low level for reception.

The detected voltage is output in the transmission period while the detected voltage is zero in the reception period because the transmission signal is not output.

The voltage detected by the detection diode 6 in FIG. 1 is amplified by the OP amp 9, and after that, is subjected to analog to digital conversion by the A/D converter 10, which supplies the resulting digital value of the detection level output to the CPU 11. The CPU 11 checks the detected voltage level and judges if the transmission level is in a normal state or an alarm (ALM) state.

In FIG. 2A, the levels indicated by dotted lines drawn over the detected voltage waveform are the alarm thresholds (ALM points).

When a voltage exceeding the ALM point is received, the CPU 11 detects an alarm assuming that the transmission signal is in an over-output (over power) state.

When the detected voltage becomes equal to or lower than the ALM point 2 in the transmission period, the CPU 11 detects an alarm indicating that the transmission level is too low (indicating a failure in the transmission part such as the transmission amplifier 1). When the CPU 11 detects an over-output in the transmission signal, the CPU 11 transmits a signal 111 to the control logic 12 to indicate the detection of the over-output. When the detected voltage becomes equal to or lower than the ALM point 2 in the transmission period, the CPU 11 transmits the signal 111 to the control logic 12 to indicate the detection of the low voltage.

Figure 3:
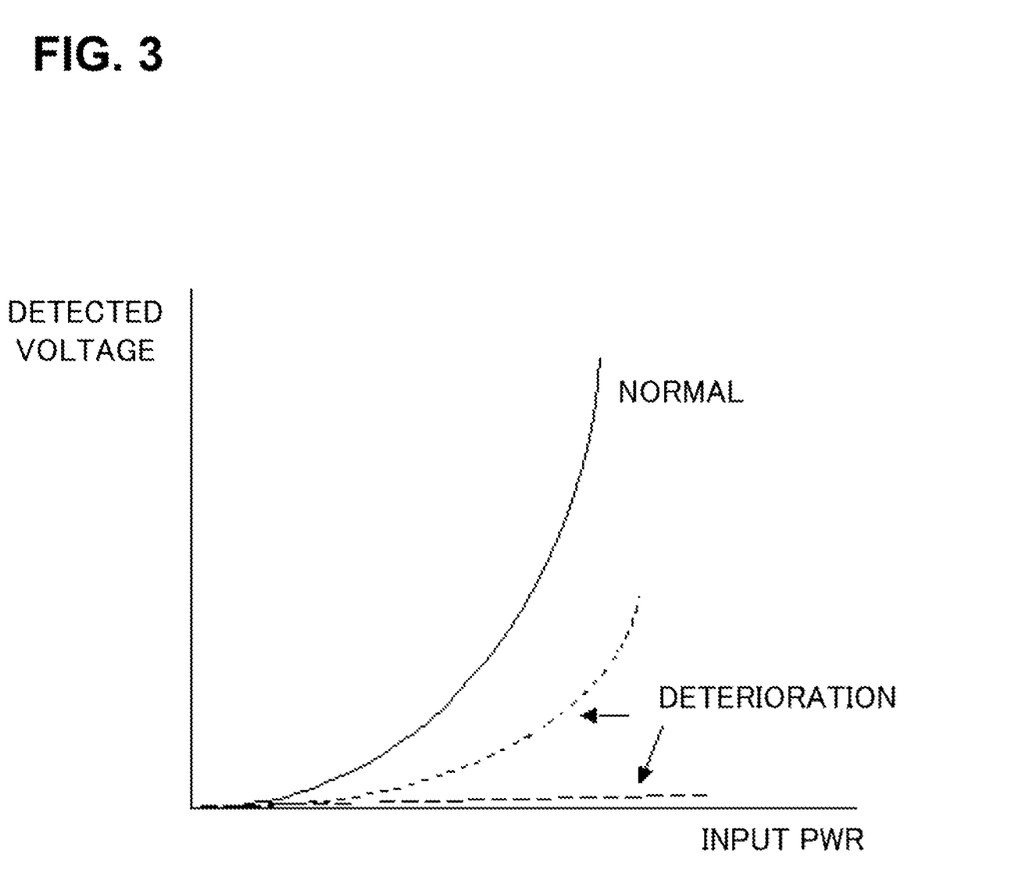
FIG. 3 is a diagram showing the characteristics of the diode.

FIG. 3 is a diagram showing a characteristic (input-output characteristic) of the detection diode 6. In FIG. 3, a horizontal axis indicates the input signal power and a vertical axis indicates the detected voltage. There is an exponential function relation between the input power received by the detection diode and the detected voltage. If the detection diode is deteriorated or damaged for some reason or other (for example, over-input), the detected voltage becomes lower than that a normal voltage or no voltage is detected (dotted line indicated by "deterioration" in FIG. 3).

In the reception period of TDD, the analog switch 7 is controlled to be turned on (conductive). The analog switch 7, connected between an output terminal of the reference current source 8 and an anode terminal of the detection diode 6, causes a predetermined constant current (reference current) to flow into the detection diode 6 during the reception operation.

Figure 4:
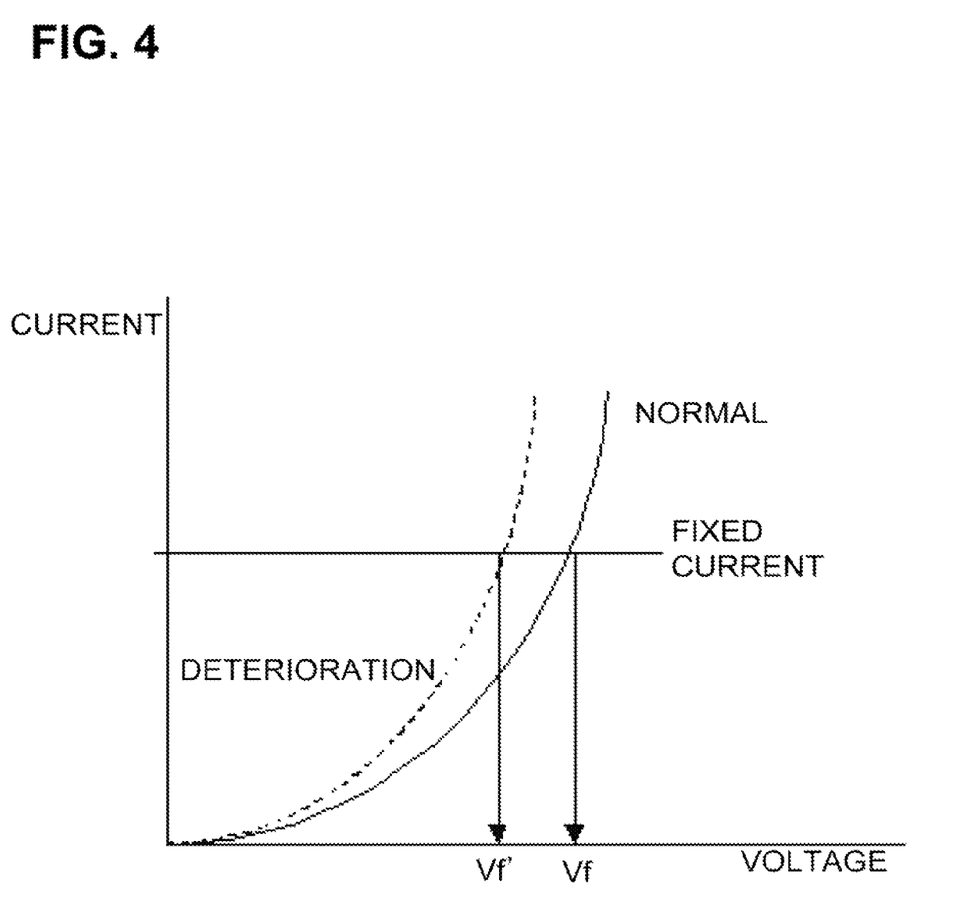
FIG. 4 is a diagram showing the V-I characteristics of the diode.

FIG. 4 is a diagram showing the I-V characteristic of the current (vertical axis) flowing in the detection diode and the voltage (horizontal axis). If the detected voltage is normal, the voltage across both ends of the diode when a stationary current flows is shown by the point indicated by Vf (forward voltage) in FIG. 4. However if the diode is deteriorated, Vf is changed from its normal voltage to Vf'. Checking a change in Vf indicates whether the detection diode is deteriorated, thus enabling to decide the accuracy of the detector.

Figure 5A:
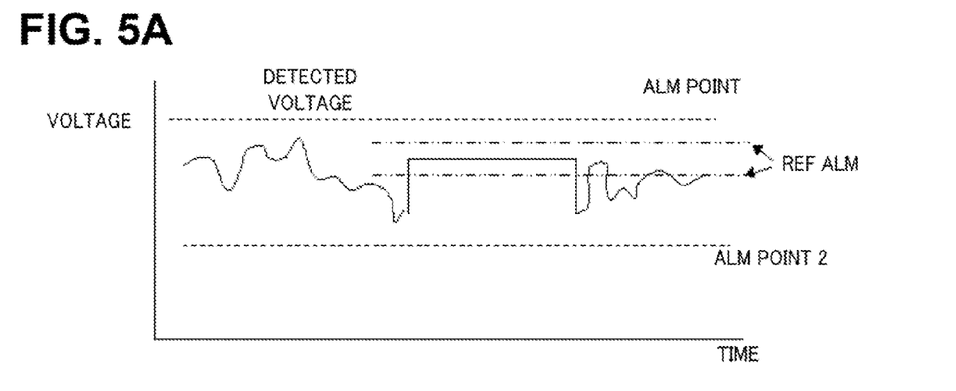
FIGS. 5A, 5B and 5C are diagrams showing the detected voltage, control signal waveform, and REF SW on/off state in the first exemplary embodiment of the present invention.
Figure 5B:
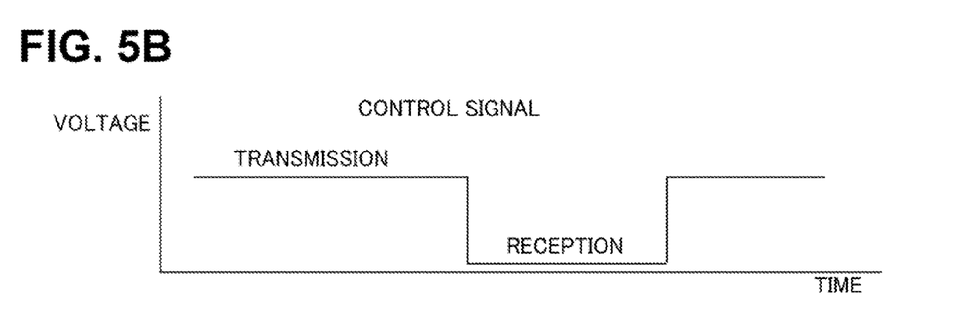
Figure 5C:
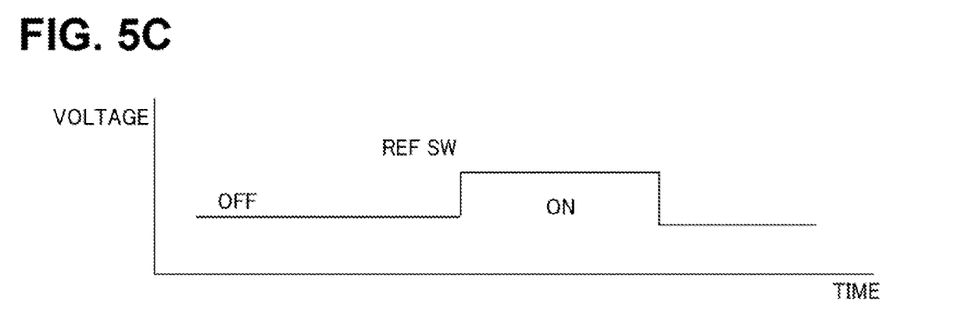

FIGS. 5A, 5B, and 5C are graphs respectively showing the following states in this exemplary embodiment with time on a horizontal axis, the voltage detected by the diode, the control signal for switching between transmission and reception, and the on/off state of the analog switch 7 in FIG. 1.

In the transmission period ("TRANSMISSION" in FIG. 5B), the voltage detected by the detection diode 6 is output as the detected voltage proportional to the transmission signal as shown in FIG. 5A. At this time, the control signal 121 is set to a transmission state and, as shown in FIG. 5C, the analog switch (REF SW) 7 is in an OFF state.

Next, in the reception period ("RECEPTION" in FIG. 5B), the transmission signal is not applied to the detection diode 6, the control signal 121 is set to a reception state, and the analog switch (REF SW) 7 is turned ON to cause a predetermined amount of current to flow through the detection diode 6.

This causes a predetermined value, corresponding to Vf shown in FIG. 4, to be output as the detected voltage. Note that, in the transmission period, whether or not the over-output of a transmission power, and a level reduction in the transmission power has occurred is determined according to the upper and lower limits (thresholds ALM point and ALM point 2) of the detected voltage. On the other hand, in the reception period, whether or not the detection diode 6 is faulty is determined according to whether or not the predetermined upper/lower voltage limits (see REF ALM in FIG. 5A) are exceeded. The REF ALM level is determined in advance considering variations in the detection diode 6. The REF ALM level, which is a voltage value obtained by flowing a predetermined amount of current thorough the detection diode 6, has a range narrower than the range of the criterion with which to judge the transmission level.

Figure 6:
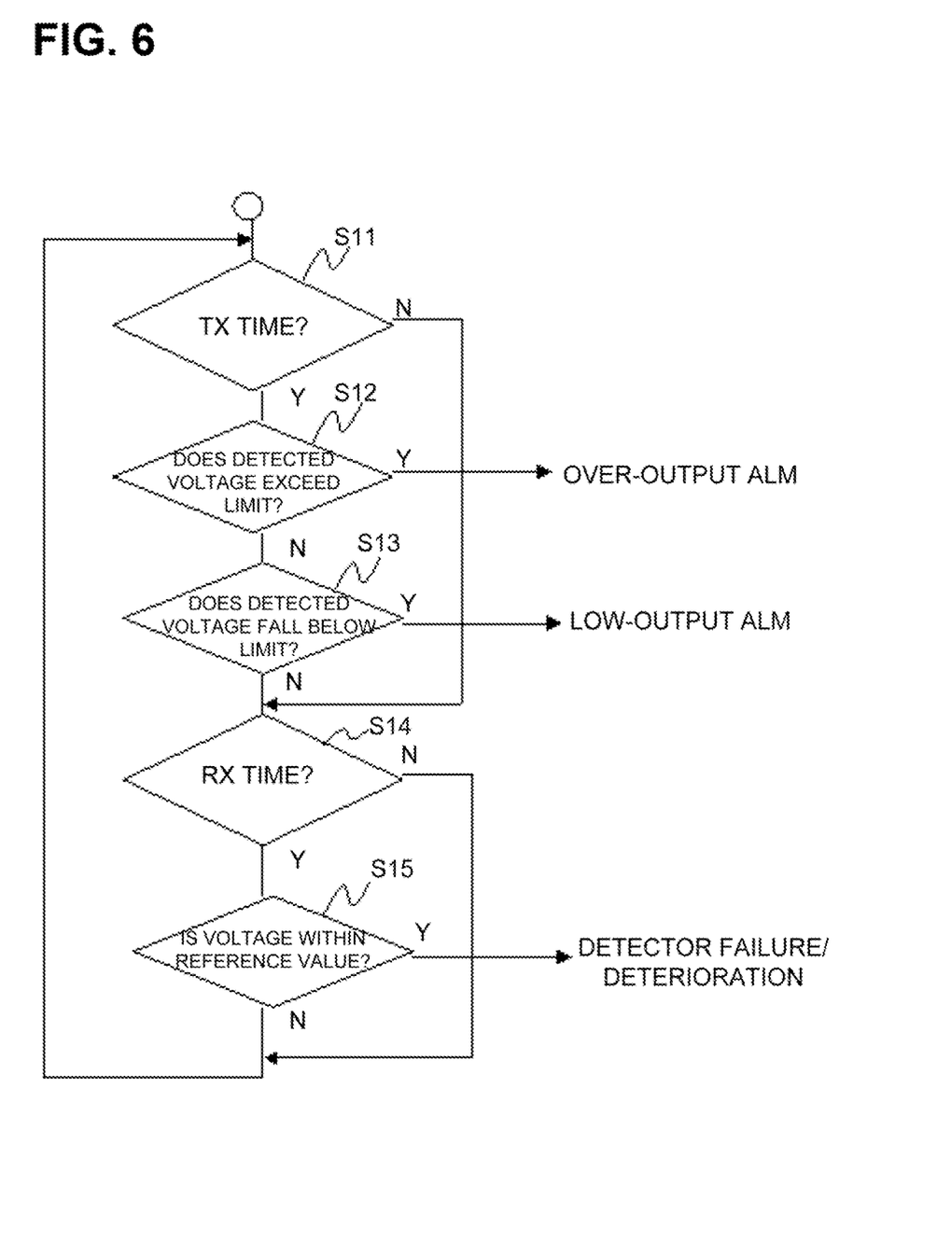
FIG. 6 is a flowchart showing the operation of the first exemplary embodiment of the present invention.

FIG. 6 is a flowchart showing the procedure for detecting an alarm in one exemplary embodiment of the present invention.

The CPU 11 checks if it is a timing of a transmission period (step S11) and, if it is a timing of the transmission period (TX time) (Y in step S11), checks whether or not the detected voltage exceeds an upper limit reference value (ALM point) (step S12).

If the detected voltage exceeds the upper limit reference value (ALM point) (Y in step S12), the CPU 11 detects an over-output alarm (over-output ALM) in the transmission power.

If the detected voltage does not exceed the upper limit reference value (ALM point) (N in step S12), the CPU 11 judges if the detected voltage falls below a lower limit reference value (ALM point 2) (step S13).

If the detected voltage falls below the lower limit reference value (ALM point 2) (Y in step S13), the CPU 11 detects a low alarm of the transmission power (low output ALM).

Next, the CPU 11 checks whether or not it is a time of the reception period (step S14). If it is a time of the reception period (RX time) (Y in step S14), judges if the voltage of the detection diode 6 exceeds or falls below the upper/lower limit values (REF ALM) of the reference value (step S15).

If the voltage of the detection diode 6 exceeds or falls below the upper/lower limit of the reference value (REF ALM) (Y in step S15), the CPU 11 detects a failure alarm of the detection diode 6.

As described above, this exemplary embodiment allows a failure in the detector that is provided for monitoring the transmission power, to be detected. This exemplary embodiment therefore prevents the circuit from going into an abnormal state caused by an over-power condition that will be generated when the detector fails. In particular, this exemplary embodiment can avoid a damage in the detection diode that may result from an over-input which is generated when an overpower condition occurs.

In addition, when the transmission level is reduced due to a failure in the transmission amplifier, this exemplary embodiment allows for the detection of a circuit status in advance in which a reduction in the transmission level cannot be detected due to a failure in the detection diode.

Furthermore, because whether or not the detection diode 6 is non-faulty is determined based on the upper/lower limits, this exemplary embodiment allows for the detection of a deterioration in the detection diode 6 that may be caused by such factors as aging, an over-input, a high temperature, ESD (Electro-Static Discharge) and so forth.

In case the present invention is not applied, for example, when the judgment criterion for an over-output is a normal operation level+2 dB and, under this condition, the detection diode 6 is deteriorated and the voltage differs from the normal voltage by 2 dB, an over-output alarm may not be judged correctly. Even in such a case, the judgment can be made correctly in advance according to the present invention.

When the voltage detected by the detection diode 6 is used not only for judging an alarm but also for ALC (automatic level control of transmission power), a transmission power malfunction may be detected as an alarm.

Another merit of the present invention is that the quality determination of the detection diode may be made using the reception period of the Time Division Duplex (TDD) scheme with no effect on the transmission signal.

Next, another exemplary embodiment of the present invention will be described.

Figure 7:
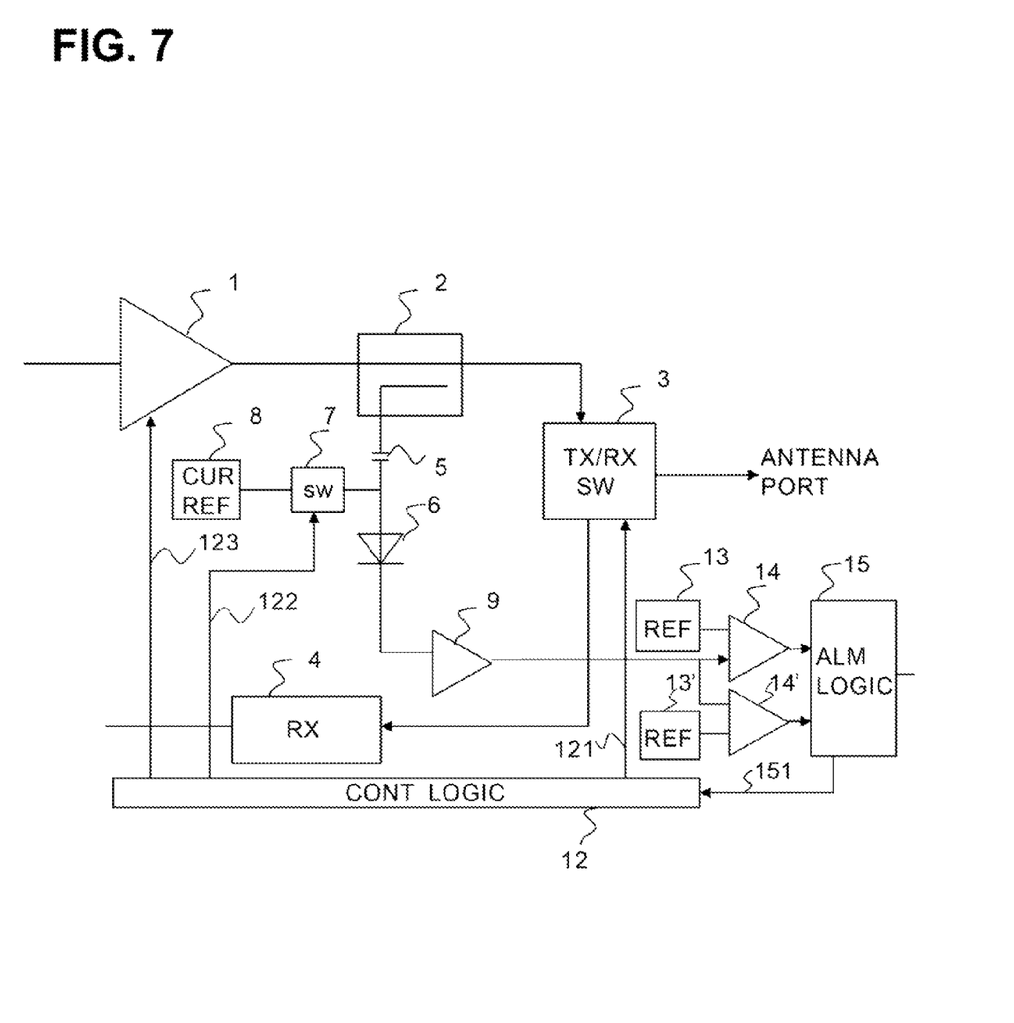
FIG. 7 is a diagram showing the configuration of a second exemplary embodiment of the present invention.

FIG. 7 is a diagram showing the configuration of a second exemplary embodiment of the present invention. Referring to FIG. 7, the detected voltage (output voltage of the OP amp 9) is determined in this exemplary embodiment on an analog basis instead of A-D converting the voltage for input to the CPU 11.

In this exemplary embodiment, the output voltage of the OP amp 9 is compared with reference voltages 13 and 13' by comparators 14 and 14' (two comparators composing a window comparator) respectively for determining if the output voltage is higher or lower than the upper limit or lower limit. For example, the comparator 14 compares the detected voltage with the upper limit value (reference voltage 13) and, depending upon whether the detected voltage is higher or lower than the upper limit value, outputs the logic value of 1 or 0. The comparator 14' compares the detected voltage with the lower limit value (reference voltage 13') and, depending upon whether the detected voltage is higher or lower than the lower limit value, outputs the logic value of 1 or 0. The outputs of the window comparator (14, 14') are output externally through an alarm logic circuit (ALM LOGIC) 15.

The reference voltages 13 and 13' that are input to the comparators 14 and 14' correspond respectively to the upper limit and lower limit of the REF ALM in FIG. 2. In FIG. 7, it is also possible to provide another window comparator which receives the output of the OP amp 9, to cause this window comparator to compare the output of the OP amp 9 with ALM and ALM2, and to supply the outputs of the two sets of window comparators to the alarm logic circuit 15. The alarm logic circuit 15 detects an over-output condition if the detected voltage (output of OP amp 9) is higher than the ALM point, and a low-level condition if the detected voltage is lower than the ALM point 2.

Figure 8:
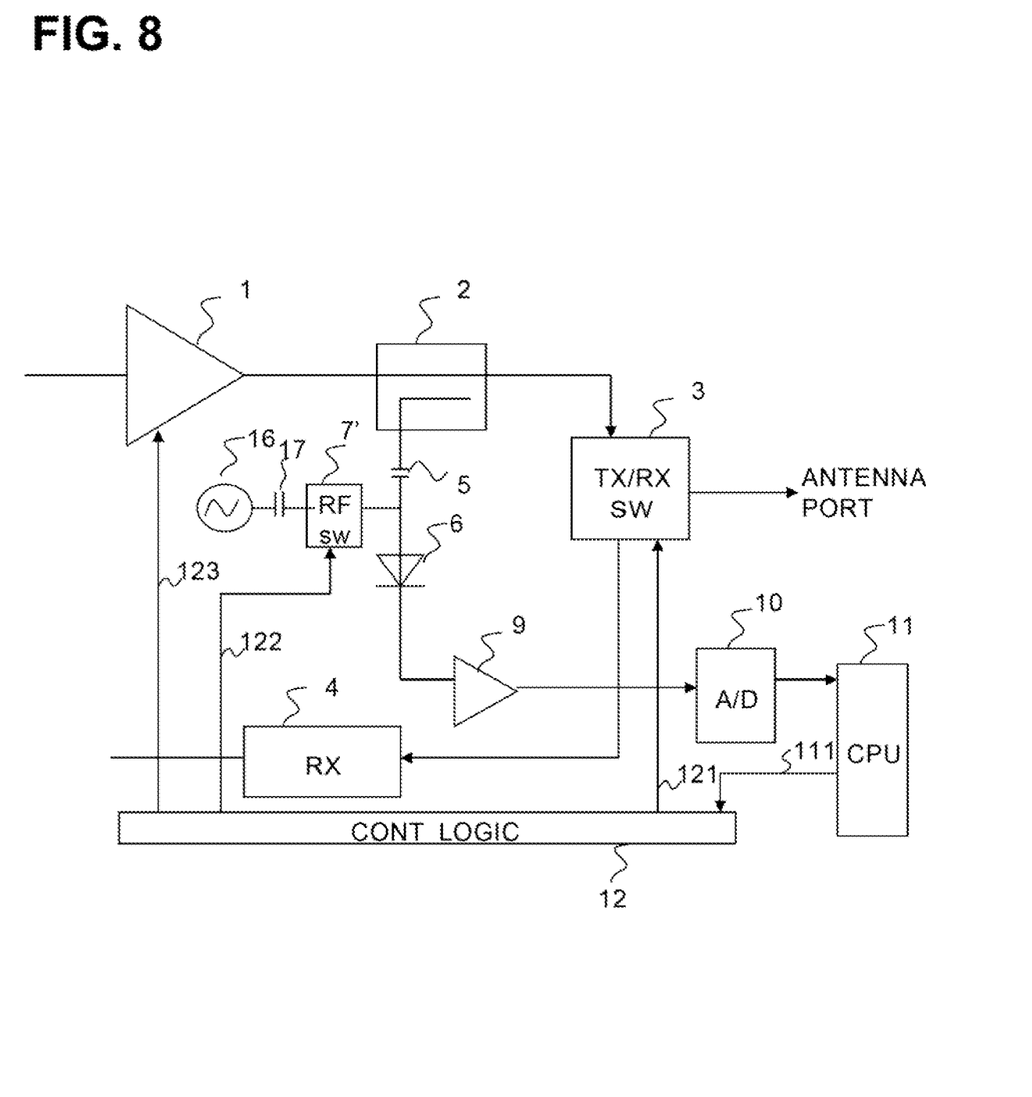
FIG. 8 is a diagram showing the configuration of a third exemplary embodiment of the present invention.

FIG. 8 is a diagram showing the configuration of a third exemplary embodiment of the present invention. Referring to FIG. 8, an example is shown in which an oscillator 16 is provided instead of the reference current source (CUR REF) 8 in the first exemplary embodiment shown in FIG. 1. A switch 7' connected to the oscillator 16 is configured, not by an analog switch, but by an RF switch that can turn on/off the RF (Radio Frequency) signal. The oscillation output signal from the oscillator 16 has its DC component cut off by a capacitor 17, and the oscillation signal (AC component) is supplied to the detection diode 6 via the RF switch 7'.

In this example, the quality determination of the detector in the reception period of TDD is made according to whether or not the detected voltage corresponding to the level of the oscillator 16 is output correctly.

Figure 9:
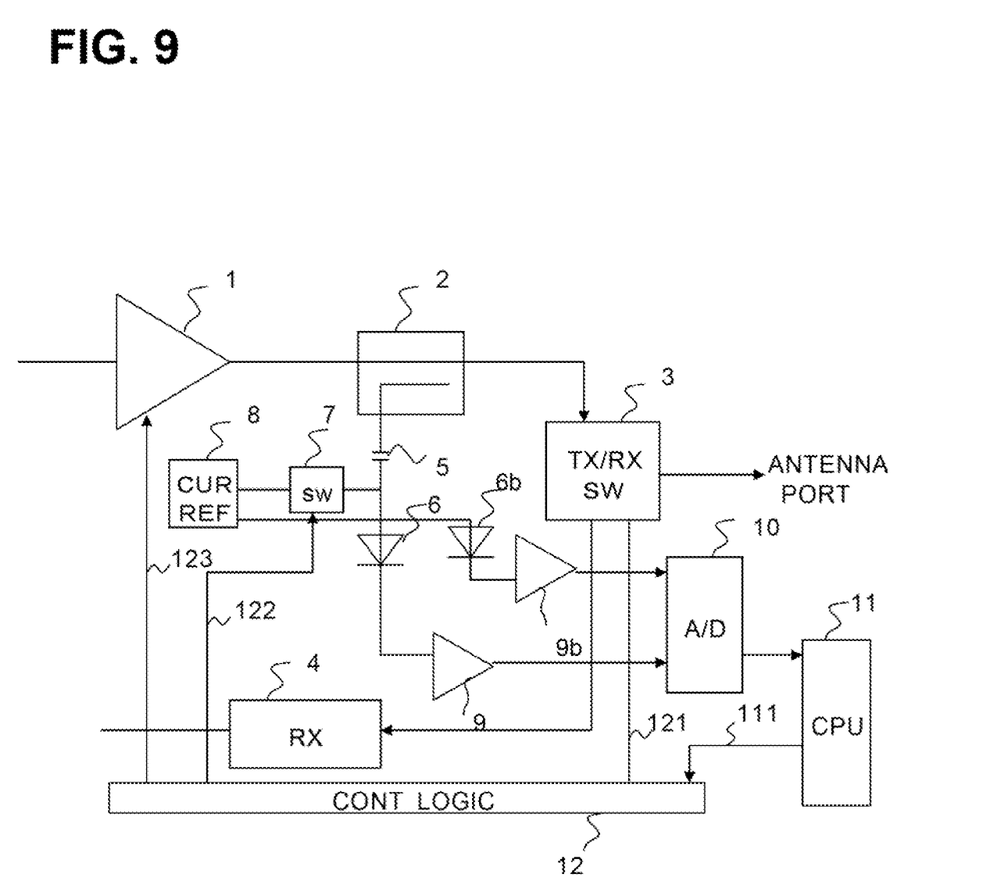
FIG. 9 is a diagram showing the configuration of a fourth exemplary embodiment of the present invention.

FIG. 9 is a diagram showing the configuration of a fourth exemplary embodiment of the present invention. Referring to FIG. 9, this exemplary embodiment differs from the first exemplary embodiment shown in FIG. 1 in that two diodes 6 and 6b are provided to compare the voltages of the two detection diodes 6 and 6b in the reception period of TDD and thereby to determine the quality of the detection diodes. The outputs of the two diodes 6 and 6b are connected to OP amps 9 and 9b, respectively. The outputs of OP amps 9 and 9b are supplied to the A/D converter 10 (2 channels), which supplies the digital signal to the CPU 11.

If the detection diodes 6 and 6b have similar characteristics, the determination may be made within a narrow threshold range even if the external condition, such as a temperature, is changed. This makes it possible to find even a slight deterioration in the diodes. In addition, even when higher accuracy is required as the transmission power monitor, the present exemplary embodiment allows the diode 6 to be calibrated (or the characteristic thereof to be corrected) using the characteristic of the diode 6b, thus providing a high-accuracy transmission power monitor.

Figure 10:
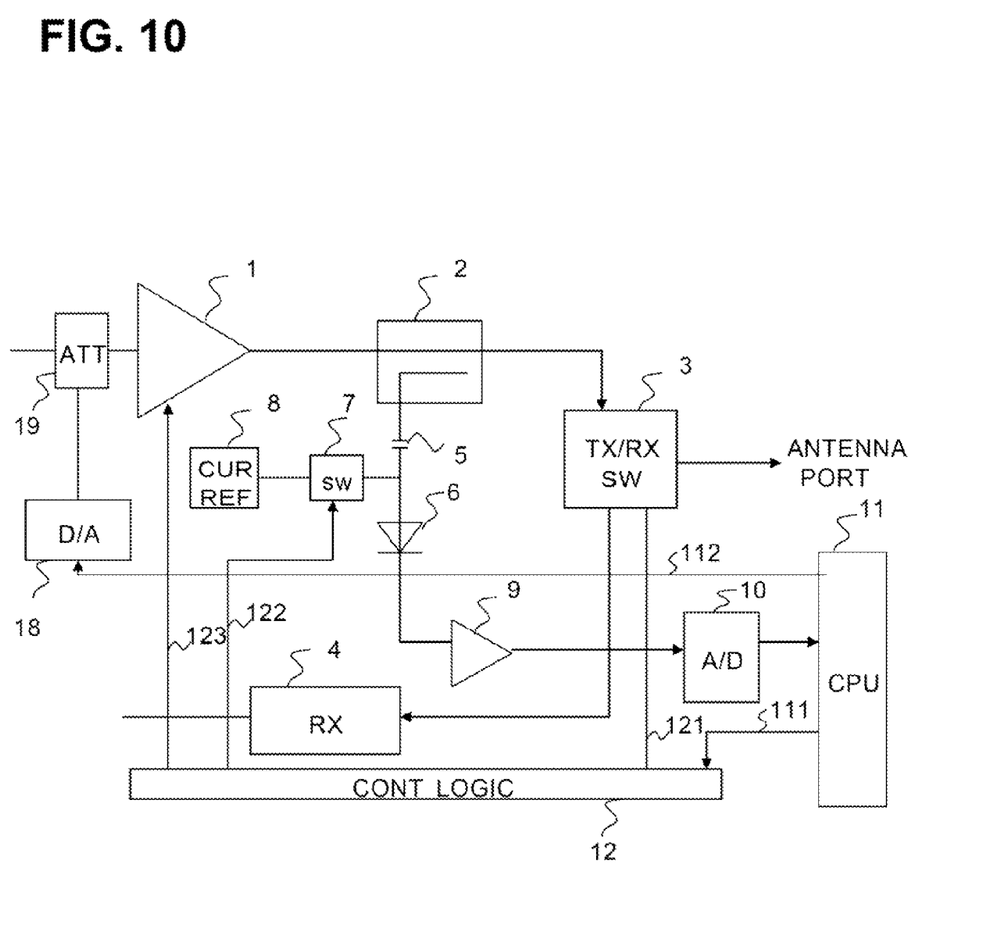
FIG. 10 is a diagram showing the configuration of a fifth exemplary embodiment of the present invention.

FIG. 10 is a diagram showing the configuration of a fifth exemplary embodiment of the present invention. Referring to FIG. 10, the present exemplary embodiment differs from the first exemplary embodiment shown in FIG. 1 in that a variable attenuator (ATT) 19, provided in the preceding stage of the transmission amplifier 1, is controlled according to the detected voltage to configure ALC (Auto Level Control) that keeps the transmission level constant. The output signal of a CPU 11 is converted by a D/A converter 18 to an analog signal and is supplied to the variable attenuator (ATT) 19 for variable attenuation. The transmission power is kept continuously constant by controlling the D/A converter 18 and the variable attenuator (ATT) 19 so that the voltage transmitted from an A/D converter 10, which receives the detected voltage, to the CPU 11 is kept constant. At this time, if the detection diode 6 is damaged, the ALC loop may become uncontrollable and an excessive amount of transmission power may be output. In such a case, this exemplary embodiment, which can find an abnormal condition in the detection diode 6, performs the control operation to turn down the variable attenuator 19 at an abnormal time, thereby preventing an excessive amount of transmission power from being emitted from the antenna.

The ALC loop in the example shown in FIG. 10, though implemented in the digital scheme using the CPU 11, may of course be configured as an analog loop.

The present invention is usefully applicable to a field where the Time Division Duplex (TDD) scheme is used and reliability is required for a apparatus such as the transmission unit of a WIMAX (Worldwide Interoperability for Microwave Access) base station.

The disclosure of Patent Document given above is hereby incorporated by reference into this specification. The exemplary embodiments and the examples may be changed and adjusted in the scope of the entire disclosure (including claims) of the present invention and based on the basic technological concept. In the scope of the claims of the present invention, various disclosed elements may be combined and selected in a variety of ways. That is, it is to be understood that the present invention includes the modifications and changes that may be made by those skilled in the art within the scope of the entire disclosure, including the claims, and based on the technological concept.

What is claimed is:

1. A radio communication apparatus employing a time division duplex (TDD) scheme and in which data is transmitted and received simultaneously by switching between a transmission signal and a reception signal, comprising:
   a detector that detects a signal branched from said transmission signal transmitted during a transmission period of the TDD scheme;
   a generator that generates a test signal which is used for testing the detector; and
   a switch that supplies said test signal to the detector during a reception period of the TDD scheme, wherein:
   the detector comprises a diode that is tested by the test signal; and
   the test signal is a preset direct current for testing the diode, wherein a decision is made whether the diode is faulty or not by outputting of the preset direct current to the diode and monitoring whether an output of the diode is within a specified range or not.

2. The transmission circuit according to claim 1, wherein an output of a current source is connected to the diode, via the switch that is turned off and on respectively during the transmission period in the TDD scheme in which the transmission signal and the reception signal are switched in a time division manner.

3. The transmission circuit according to claim 2, further comprising a second unit that, based on an output of the detector, finds pass or fail of the detector, and makes a determination if the output of the diode, generated when the preset current is supplied from the current source to the detection diode during the reception period, is within a predetermined specified range, and
if the output of the diode is out of the specified range, makes a judgment that the detector is faulty to output a signal indicating an alarm to a control unit.

4. The transmission circuit according to claim 2, wherein the detector comprises
plurality of detection diodes, including the diode, that receive in common a branched signal of the transmission signal, a current from the current source being supplied to the plurality of detection diodes via the switch, during the reception period,
the second unit comparing output voltages of the plurality of detection diodes to decide pass or fail of the detection diodes.

5. The transmission circuit according to claim 1, wherein an output of an oscillator connected to the diode via the switch that is turned off and on, respectively, during the transmission period and the reception period in the TDD scheme in which the transmission signal and the reception signal are switched in a time division manner.

6. The transmission circuit according to claim 5, further comprising a second unit that, based on an output of the detector, finds pass or fail of the detector, and makes a determination if the output of the diode is within a specified range corresponding to a level of the oscillator, during the reception period, and
if the output is out of the specified range, makes a judgment that the detector is faulty to output a signal indicating an alarm to a control unit.

7. The transmission circuit according to claim 1, further comprising a second unit that, based on an output of the detector, finds pass or fail of the detector, and during the transmission period, compares a detection output of the detector with an upper limit value corresponding to an over-output and with a lower limit value corresponding to a low-output, and if over-output or low-output is found, outputs a signal indicating an over-output alarm or a low-output alarm to a control unit.

8. The transmission circuit according to claim 1, further comprising a second unit that, based on an output of the detector, finds pass or fail of the detector, the second unit comprising:
an analog-to-digital conversion circuit that converts an detection output of the detector to a digital signal; and
a computing unit that receives an output of the analog-to-digital conversion circuit, the computing unit, based on an output of the analog-to-digital conversion circuit, finding pass or fail of the detector during the reception period and finding over-output or low-output during the transmission period.

9. The transmission circuit according to claim 1, further comprising a second unit that, based on an output of the detector, finds pass or fail of the detector, the second unit comprising:
first and second comparators that compare an detection output of the detector with an upper limit value and with a lower-limit value; respectively, and
a control circuit that receives outputs of the first and second comparators, the control circuit, based on the outputs of the first and second comparators, finding pass or fail of the detector during the reception period and finding over-output or low-output during the transmission period.

10. The transmission circuit according to claim 1, further comprising a second unit that, based on an output of the detector, finds pass or fail of the detector, the second unit comprising:
an analog-to-digital conversion circuit that converts the detected voltages of the plurality of detection diodes to a digital signal; and
a computing unit that receives outputs of the analog-to-digital conversion circuit.

11. The transmission circuit according to claim 1, further comprising:
a transmission amplifier that amplifies and outputs the transmission signal; and
an attenuation circuit that variably controls an attenuation rate of the signal, which is supplied to the transmission amplifier, in accordance with the detection output of the detector.

12. A method of testing a radio communication apparatus employing a time division duplex (TDD) scheme in which data is transmitted and received simultaneously by switching a transmission signal and a reception signal, the method comprising:
detecting, by a detector, a signal branched from said transmission signal transmitted during a transmission period of the TDD scheme;
generating a test signal which is used for testing the detector; and
supplying, by a switch, said test signal to the detector during a reception period of the TDD scheme,
wherein a decision is made whether a diode constituting the detector is faulty or not by outputting of a preset direct current to the diode and monitoring whether an output of the diode is within a specified range or not.

13. The test method of a detector according to claim 12, wherein the preset current is supplied to a detection diode constituting the detector, during the reception period in the TDD scheme in which the transmission signal and the reception signal are switched in a time division manner.

14. The test method of a detector according to claim 13, comprising
making a determination whether or not the output of the detection diode, generated when a preset current is supplied from the current source to the detection diode during the reception period, is within a predetermined specified range; and
if the output is out of the specified range, making a judgment that the detector is faulty to output an alarm.

15. The test method of a detector according to claim 12, wherein an output of an oscillator is supplied to the detector via a switch that is turned on during the reception period in the TDD scheme in which the transmission signal and the reception signal are switched in a time division manner.

16. The test method of a detector according to claim 15, comprising:
- making a determination whether or not the output of the detector is within a specified range corresponding to a level of the oscillator, during the reception period; and
- if the output is out of the specified range, making a judgment that the detector is faulty to output an alarm.

17. The test method of a detector according to claim 12, comprising:
- comparing a detection output of the detector with an upper limit value corresponding to an over-output and with a lower limit value corresponding to a low-output, during the transmission period; and
- outputting an over-output alarm or a low-output alarm, if over-output or low-output is found.

* * * * *